United States Patent [19]

Corley

[11] Patent Number: 4,654,383

[45] Date of Patent: Mar. 31, 1987

[54] FLAME-RETARDANT EPOXY RESINS

[75] Inventor: Larry S. Corley, Houston, Tex.

[73] Assignee: Shell Oil Company, Houston, Tex.

[21] Appl. No.: 802,805

[22] Filed: Nov. 27, 1985

[51] Int. Cl.$^4$ ................................................ C08K 7/14
[52] U.S. Cl. .................................... 523/462; 428/417;
525/121
[58] Field of Search ................ 523/462; 524/469, 470;
525/121; 428/417

[56] References Cited

U.S. PATENT DOCUMENTS

| 3,050,476 | 8/1962 | Tress et al. | 260/2.5 |
| 3,884,992 | 5/1975 | Shimizu et al. | 260/837 R |
| 3,932,321 | 1/1976 | Maki et al. | 525/121 |
| 3,959,398 | 5/1976 | Jalics | 526/296 |
| 4,020,225 | 4/1977 | Fujiwara et al. | 428/251 |
| 4,021,403 | 5/1977 | Fujiwara et al. | 260/42.28 |
| 4,101,510 | 7/1978 | Spanswick | 524/435 |
| 4,107,230 | 8/1978 | Turnbo et al. | 524/411 |
| 4,137,212 | 1/1979 | Theysohn et al. | 260/37 N |

OTHER PUBLICATIONS

F. E. Bennett et al—Applied Plastics, vol. 10, No. 1, Jan. 1967, pp. 45-51.

Primary Examiner—Veronica P. Hoke

[57] ABSTRACT

A composition is provided comprising an epoxy resin, a curing agent for the epoxy resin, and a halogenated aromatic vinyl monomer. The composition exhibits sufficiently low viscosity to be suitable for fiber-reinforced composites applications, high Tg and flame retardancy.

25 Claims, No Drawings

FLAME-RETARDANT EPOXY RESINS

BACKGROUND OF THE INVENTION

This invention relates to epoxy resin compositions. In one aspect, the invention relates to methods for imparting flame retardancy to epoxy resin compositions. In a specific aspect, the invention relates to flame-retardant epoxy compositions having suitable uncured viscosity and cured heat resistance for use in reinforced composites.

Present techniques for imparting flame retardance to epoxy resins generally have one or more disadvantages. A common technique is to prepare an epoxy resin, which is conventionally prepared from the reaction of epichlorohydrin with bisphenol-A, from a brominated bisphenol, such as tetrabromobisphenol-A. This can be done by fusing a preformed liquid epoxy resin with a brominated bisphenol in the presence of a fusion catalyst such as a quaternary phosphonium halide. This technique, however, produces a resin which is solid at room temperature and must be diluted with large quantities of solvents in order to reduce its viscosity to a level suitable for impregnation of reinforcing fibers. Furthermore, the necessity for removal of these solvents causes a number of processing difficulties in the manufacture of fiber-reinforced composites. In addition, these resin molecules have long distances between epoxy groups and cure to materials with relatively low crosslink density and low heat resistance.

An alternate route to preparing flame-retardant epoxy resins involves the reaction of tetrabromobisphenol-A directly with epichlorohydrin to produce a low molecular weight brominated epoxy resin. This cured resin exhibits heat resistance similar to that of standard liquid epoxy resins cured with the same curing agents. However, the diglycidyl ether of tetrabromobisphenol-A is a relatively high-melting crystalline solid which tends to crystallize out of mixtures with other epoxy resins and diluents on standing. It is thus difficult to formulate into stable liquid epoxy systems.

Flame-retardant cured epoxy systems can also be prepared by curing standard liquid epoxy resins with halogenated polyphenols such as brominated poly(hydroxystyrene). These solid polymeric curing agents, however, yield resin/curing agent mixtures of such high viscosity that they require substantial quantities of solvents to reduce the viscosity to levels suitable for fiber impregnation at room temperature.

A further route to flame retardancy in epoxy resins is the addition of a nonreactive liquid flame retardant such as tris(2,3-dibromopropyl)phosphate or pentabromodiphenyl ether. This technique, unlike certain ones previously described, generally does not increase the viscosity of liquid epoxy resins and requires no solvent dilution. However, these systems suffer from the disadvantage that the unreactive liquid additive remains in the resin after cure as small molecules which plasticize the cured resin matrix and lower its heat resistance.

Yet another way to prepare a flame-retardant epoxy resin system is to add a high-melting organic powder such as decabromodiphenyl ether or an inorganic powder such as alumina trihydrate. These powders melt at temperatures higher than the glass transition temperature of the epoxy matrix and thus do not generally decrease the heat resistance of the cured systems. However, the solid additives do not dissolve in the liquid resin/curing agent mixture before cure but remain as solid suspensions. During fiber impregnation, the fibers often tend to "filter" the solid particles out of the resin mixture. Agglomeration of the particles may lead to clogging of close-tolerance orifices and create other processing difficulties in obtaining a cured fiber-reinforced composite from such a system.

The ideal flame retardant for epoxy systems would be a low-viscosity liquid which would reduce the viscosity of the resin/curing agent mixture. During resin cure, the flame retardant would either react with the resin in a manner which would not bring about a reduction in the glass transition temperature or heat distortion temperature of the resin, or would polymerize with itself to produce a second phase which would not lower resin properties.

Certain polymerizable flame retardants, such as vinyl bromide and 2,3-dibromopropyl acrylate, are known in the industry. Vinyl bromide has the disadvantage of vaporizing at temperatures customarily used for epoxy curing. Acrylate polymers customarily have glass transition temperatures lower than those of cured epoxy systems. The polymers of brominated acrylates, therefore, would be expected to lower the heat resistance of epoxy resins containing them, since they would be expected to contribute little to network strength when heated above their Tg.

It is therefore an object of the invention to provide a flame-retardant epoxy resin composition. It is a further object to provide a flame-retardant epoxy resin composition which exhibits low uncured viscosity and high cured Tg.

SUMMARY OF THE INVENTION

According to the invention, a composition is provided comprising (a) an epoxy resin, (b) a curing agent for the epoxy resin, and (c) a halogenated vinyl aromatic monomer. The composition may optionally contain a free radical initiator, a non-halogenated vinyl monomer and/or a curing accelerator. The composition is particularly suited for preparing reinforced composites, and for such applications the starting epoxy resin will preferably be a liquid resin. The halogenated styrene monomer imparts flame-retardancy and low viscosity without appreciably lowering Tg.

DETAILED DESCRIPTION OF THE INVENTION

The epoxy resin component of the invention compositions can be any curable epoxy resin having, on the average, more than one vicinal epoxide group per molecule. The epoxy resin can be saturated or unsaturated, aliphatic, cycloaliphatic, aromatic or heterocyclic, and may bear substituents which do not materially interfere with the curing reaction. They may be monomeric or polymeric.

Suitable epoxy resins include glycidyl ethers prepared by the reaction of epichlorohydrin with a compound containing at least one hydroxyl group carried out under alkaline reaction conditions. The epoxy resin products obtained when the hyroxyl group-containing compound is bisphenol-A are represented below by structure I wherein n is zero or a number greater than 0, commonly in the range of 0 to 10, preferably in the range of 0 to 2.

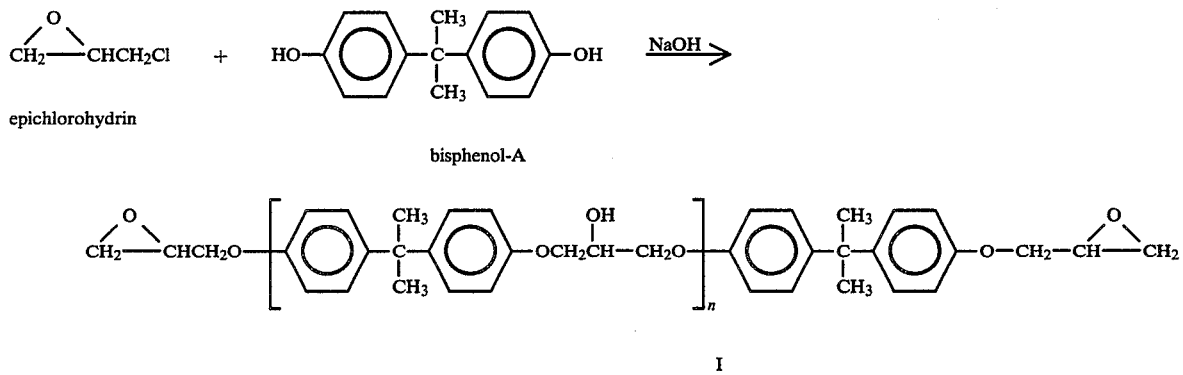

I

Other suitable epoxy resins can be prepared by the reaction of epichlorohydrin with mononuclear di- and trihydroxy phenolic compounds such as resorcinol and phloroglucinol, selected polynuclear polyhydroxy phenolic compounds such as bis(p-hydroxyphenyl)methane and 4,4'-dihydroxybiphenyl, or aliphatic polyols such as 1,4-butanediol and glycerol.

Epoxy resins suitable for the invention compositions have molecular weights generally within the range of 50 to about 10,000, preferably about 200 to about 1500. The commercially available epoxy resin EPON® Resin 828, a reaction product of epichlorohydrin and 2,2-bis(4-hydroxyphenyl)propane (bisphenol-A) having a molecular weight of about 400, an epoxide equivalent (ASTM D-1652) of about 185-192, and an n value in formula I above of about 0.2, is presently the preferred epoxy resin because of its low viscosity and commercial availability.

The particular curing agent component of the invention composition is not critical and can be, for example, an aliphatic amine such as 1,2-diaminocyclohexane, an aromatic amine such as 2,4-bis(p-aminobenzyl)aniline, a cyclic anhydride such as trimellitic anhydride, an imidazole such as 2-ethyl 4-methylimidazole, or a cationic curing agent such as a boron trifluoride complex, present in an amount effective to cure the epoxy resin. The curing agent will generally be present in an amount of about 1 to about 300 weight percent, based on the weight of the epoxy resin, preferably about 3 to about 100 weight percent.

The invention composition further contains a halogenated vinyl aromatic monomer. The halogenated vinyl aromatic monomer will preferably have at least one halide substituent on the aromatic ring. Suitable halogenated vinyl aromatic monomers include compounds represented by the formula

in which X is halide, preferably bromide, R is —CH=CH₂, alkyl, aryl or alkaryl and at least one R is vinyl-terminated, m is 1 or 2, and n is 1-5. Such halogenated vinyl aromatic monomers include, for example, chlorostyrene, trichlorostyrene, bromostyrene, iodostyrene and 2,5-dibromo-4-methylstyrene. The preferred class of halogenated vinyl aromatic monomers are brominated styrenes. The preferred halogenated vinyl aromatic monomer, because of its availability and effectiveness as a flame retardant, is dibromostyrene. The halogenated vinyl aromatic compound will generally be present in the composition in an amount of from about 5 to about 70 weight percent, preferably about 15 to about 50, most preferably about 20 to about 45 weight percent, based on the weight of the composition.

The invention composition optionally includes a free radical initiator present in an amount effective to cross-link the vinyl groups of the halogenated vinyl aromatic compound. Examples of such initiators include the peroxides, such as benzoyl peroxide, tertiary butyl hydroperoxide, ditertiary butyl peroxide, hydrogen peroxide, potassium peroxydisulfate, bis(methylcyclohexyl)peroxide, cumene hydroperoxide, acetyl benzoyl peroxide, Tetralin hydroperoxide, phenylcyclohexane hydroperoxide, tertiary butyl peroxyacetate, dicumyl peroxide, tertiary butyl peroxybenzoate, and the like, and mixtures thereof; azo compounds such as 2,2'-azobisisobutyronitrile, dimethyl 2,2'-azobisisobutyrate, 2,2'-azobis(2,4-dimethylvaleronitrile), 2,2'-azobisisobutyramide, 2,2'-azobis(2-acetoxypropane), and the like. Particularly preferred initiators include the dialkyl peroxides, tertiary alkyl hydroperoxides, and alkyl esters of peroxycarboxylic acids. Especially useful peroxides include tertiary butyl peroxy(2-ethylhexanoate) and 2,5-bis(tertiary butyl peroxy)-2,5-dimethylhexane.

The amount of the free-radical initiator employed can vary over a broad range depending, for example, upon the type of initiator chosen, the processing conditions, and the end-use properties desired. In general, a curing amount of the free radical initiator is used. The amount of the free radical initiator will, for most purposes, vary within the range of about 0.001 to about 10 weight percent, preferably about 0.01 to about 5 weight percent, based on the weight of the epoxy resin.

The invention composition optionally contains one or more unhalogenated vinyl monomers such as styrene, divinylbenzene or trimethylolpropane trimethacrylate. The amount of the unsaturated monomer can vary widely depending upon the nature of the system employed and the properties desired in the system, but would generally be expected to range from about 0 to about 50 weight percent, based on the weight of the epoxy resin.

The low viscosity of the invention curable epoxy resin system makes it suitable for use in fiber-reinforced composites applications, for which a fibrous reinforcing material, such as chopped glass, glass fiber, carbon fiber and the like, in the form of a mat, cloth or continuous unidirectional fibers, for example, is impregnated with the epoxy resin system. The impregnated fibers are usually subjected to a relatively mild heat treatment to partially cure the resin to a flexible, tacky state, or "prepreg." The prepreg is then subjected to elevated temperature and pressure so as to completely cure the resin to a hard, inflexible state. A plurality of prepregs can be layered and cured to form a laminate having utility, for example, in electrical applications such as circuit boards. For such electrical applications, the properties of flame retardancy and high Tg are particularly important.

EXAMPLE

EPON® Resin 828 was mixed in a 1 liter beaker with dibromostyrene, other monomers, additives and curing agents as indicated in Table 1. Each mixture was blended for 2 to 3 minutes with a Jiffy mixer and centrifuged to remove gas bubbles. Brookfield viscosity and gel times on gel plates set at various temperatures were determined for some of the mixtures. One portion of each mixture was poured into a mold of glass sheets separated by a polytetrafluoroethylene spacer 3.2 mm thick. Another portion was poured into aluminum molds containing a linear cavity 12.7 mm square to form a bar. The sheet and bar molds were placed in an oven for the various cure cycles indicated in Table 1. The castings were removed from the molds and tested for mechanical properties. Bars were also cut from the casting and tested for flammability according to the ANSI UL94 procedure.

One can see from Table 1 that flame retardant epoxies can be obtained by dibromostyrene modification of epoxies cured with a wide variety of curing agents. These curing agents include aromatic amines, anhydrides, aliphatic amines, imidazoles, and BF$_3$ complexes. Different amounts of dibromostyrene are required for effective flame retardance depending on which curing agent is used and on whether a second monomer (such as trimethylolpropane trimethacrylate, TMPTMA) is also used in the formulation. In all of the mixtures containing dibromostyrene in which viscosity was measured, viscosity drops with increasing concentration of dibromostyrene. Many of the mixtures containing dibromostyrene had a room temperature viscosity of below 1 Pa.s, within the range in which easy wetout of reinforcing fibers can occur at room temperature. Furthermore, because the dibromostyrene polymerized during epoxy resin cure, physical properties of the castings (including heat resistance) generally did not decrease with increasing dibromostyrene concentration used.

Note also that in the systems cured with the TMPTMA-modified aromatic amine curing agent (A), the system containing styrene as diluent failed the flame test, while that modified with 38 phr dibromostyrene passed as 94V-0.

TABLE 1

| Monomer (parts) (b) | Curing Agent (parts) (c) | Additives (parts) (d) | Brookfield Viscosity, mPa.s (Temp., °C.) | 90° C. Gel Time, sec. | 120° C. Gel Time, sec. | 150° C. Gel Time, sec. | Cure Cycle (e) | HDT, 264 psi °C. (ASTM D-648) | Rheometrics, Tg, °C. (tan delta peak) |
|---|---|---|---|---|---|---|---|---|---|
| DBS (46) | A (38) | | 1160 (22.2) | | | 410 | A | | |
| DBS (46) | A (38) | | | | | | A | 162, 164 | 180 |
| S (12) | A (38) | | 1760 (22) | | | | A | | |
| S (12) | A (38) | | | | | | A | 162, 163 | 179 |
| DBS (46) | A (38) | S (1) | 1320 (22) | | | 70 | A | 148, 149 | 170 |
| DBS (50) | B (50) | TBAB (1) | | | | 95 | B | | 198 |
| DBS (60) | B (50) | TBAB (1) | | | | | B | 163 | |
| DBS (70) | B (50) | TBAB (1) | | | | | B | 162 | |
| DBS (39) | DACH (17) | | 812 (24) | 800 | 245 | 105 | C | 124, 129 | |
| DBS (45) TMPTMA (20) | DACH (17) | | 354 (24) | 1300 | 420 | 170 | C | 134, 137 | |
| DBS (50) | DACH (17) | | 205 (22.5) | | | | C | | |
| DBS (60) | DACH (17) | | 142 (22.5) | | | | C | | |
| DBS (70) | DACH (17) | | | | | | D | 117 | |
| DBS (80) | DACH (17) | | | | | | D | 122 | |
| DBS (40) | C (3) | | 940 (22.5) | | | | A | | |
| DBS (50) | C (3) | | 625 (22.5) | | | | A | 130 | |
| DBS (60) | C (3) | | 425 (22.5) | | | | A | 131 | |
| DBS (40) | BFEB (5) | | | | | | C | | |
| DBS (50) | BFEB (5) | | | | | | C | 109 | |

| Monomer (parts) (b) | Curing Agent (parts) (c) | Additives (parts) (d) | R.T. Tensile Strength, MPa (ASTM D-638) | R.T. Tensile Modulus, MPa (ASTM D-638) | R.T. Tensile Elongation, % (ASTM D-638) | Bromine in total Mixture (%) | Total Burn Time, Sec. (ANSI UL94 (f) | ANSI UL94 Classification |
|---|---|---|---|---|---|---|---|---|
| DBS (46) | A (38) | | | | | 15.2 | | |
| DBS (46) | A (38) | | 57 | 3070 | 2.3 | 15.2 | 2 | 94 V-0 |
| S (12) | A (38) | | | | | 0 | | |
| S (12) | A (38) | | 62 | 2920 | 3.3 | 0 | (g) | Failed |
| DBS (46) | A (38) | S (1) | 58 | 3480 | 2.1 | 15.1 | 3 | 94 V-0 |
| DBS (50) | B (50) | TBAB (1) | 54 | 3520 | 1.9 | 15.2 | 27 | 94 V-1 |
| DBS (60) | B (50) | TBAB (1) | 43 | 3210 | 1.5 | 17.4 | 7.5 | 94 V-0 |
| DBS (70) | B (50) | TBAB (1) | 46 | 3470 | 1.6 | 19.3 | 6 | 94 V-0 |
| DBS (39) | DACH (17) | | 62 | 3170 | 2.6 | 15.2 | (g) | Failed |
| DBS (45) TMPTMA (20) | DACH (17) | | 60 | 3230 | 2.4 | 15.0 | (g) | Failed |
| DBS (50) | DACH (17) | | | | | 18.2 | (g) | Failed |
| DBS (60) | DACH (17) | | | | | 20.6 | 238 | Failed |
| DBS (70) | DACH (17) | | 69 | 3360 | 2.8 | 22.8 | 166 | Failed |
| DBS (80) | DACH (17) | | 85 | 3190 | 4.2 | 24.7 | 25.5 | 94 V-1 (h) |
| DBS (40) | C (3) | | 62 | 2860 | 2.9 | 17.0 | 81 | 94V-1 |

TABLE 1-continued

| | | | | | | | |
|---|---|---|---|---|---|---|---|
| DBS (50) | C (3) | 59 | 2990 | 2.5 | 19.9 | 60 | 94 V-1 |
| DBS (60) | C (3) | 51 | 2920 | 2.0 | 22.4 | 17 | 94 V-0 |
| DBS (40) | BFEB (5) | | | | 16.8 | 166 | Failed |
| DBS (50) | BFEB (5) | 14 | 2990 | 0.5 | 19.6 | 17 | 94V-0 |

(a) All mixtures contained 100 parts EPON ® Resin 823 and 0.4 parts Lupersol 101 (2,5-bis(t-butylperoxy)-2.5-dimethylhexane).
(b) S = styrene; DBS = dibromostyrene; TMPTMA = trimethylolpropane trimethacrylate. All added monomers contained 1000 ppm phenothiazine as inhibitor.
(c) Curing Agent A is a mixture containing 50% Upjohn Curithane 116 (crude methylenedianiline, MDA), 23.7% DuPont BABA (crude 2,4-bis-(p-aminobenzyl) aniline), and 26.3% TMPTMA (trimethylolpropane trimethacrylate, inhibited with 1000 ppm hydroquinone).
Curing Agent B is a mixture of 97% trimellitic anhydride (TMA) and 3% methylhexahydrophthalic anhydride (MHHPA).
DACH = 1,2-diaminocyclohexane (Milliken Millamine 5260)
Curing Agent C is a mixture of 85% 2-ethyl-4-methylimidasole and 15% 2-methylimidasole.
BFEB = a liqud mixture containing 70% by weight $BF_3 \cdot C_2H_5NH_2$ and 30% by weight 1,4-butanediol.
(d) Accelerator S is a liquid sulfonium salt prepared by condensing 2 moles of 2-(ethylthio)ethanol with 1 equivalent of 48% aqueous $HBF_4$. TBAB = tetrabutylammonium bromide.
(e) Cure cycle A = 2 hours at 80° C., followed by 1 hour at 120° C., 1 hour at 150° C. and 1 hour at 175° C.
Cure cycle B = 2 hours at 150° C.
Cure cycle C = 2 hours at 80° C., followed by 2 hours at 150° C.
Cure cycle D = 2 hours at 80° C., followed by 1 hour at 150° C.
(f) Five 127 mm × 12.7 mm × 3.175 mm bars of cast unreinforced resin were held 12.7 mm over the 19 mm flame of a burner and each ignited twice. The total burning time for the ten ignitions is given.
(g) Only two bars were tested; both burned for their full length.
(h) Would have been classified 94 V-0 except that one bar burned 11 seconds.

I claim:

1. A composition comprising
   (a) an epoxy resin,
   (b) an effective amount of a curing agent for the epoxy resin, and
   (c) from about 5 to about 70 weight percent, based on the weight of the composition, of a halogenated vinyl aromatic monomer which has the formula

where X is halogen, R is —CH=CH₂, alkyl, aryl or alkaryl and at least one R is —CH=CH₂, m is 1 to 5 and n is 1 or 2.

2. The composition of claim 1 in which the halogenated vinyl aromatic monomer is dibromostyrene.

3. The composition of claim 1 in which the epoxy resin is a diglycidyl ether of bisphenol-A.

4. The composition of claim 2 in which the halogenated vinyl aromatic monomer is present in an amount of about 15 to about 50 weight percent.

5. The composition of claim 2 which further comprises an effective amount of a free radical initiator.

6. The composition of claim 1 in which the curing agent is selected from the group consisting of aliphatic amines, aromatic amines, cyclic anhydrides, imidazoles and BF₃ complexes.

7. The composition of claim 1 in which the curing agent is present in an amount of from about 1 to about 300 weight percent, based on the weight of the epoxy resin.

8. The composition of claim 1 in which the curing agent is selected from the group consisting of methylenedianiline, 2,4-bis(p-aminobenzyl)aniline, trimellitic anhydride, 2-ethyl-4-methylimidazole, 1,2-diaminocyclohexane, and BF₃.C₂H₅NH₂.

9. The composition of claim 1 which further comprises a nonhalogenated vinyl monomer.

10. The composition of claim 9 in which the nonhalogenated vinyl monomer is selected from the group consisting of styrene, divinylbenzene and trimethylolpropane trimethacrylate.

11. The composition of claim 9 in which the nonhalogenated vinyl monomer is present in an amount of from about 0 to about 50 weight percent, based on the weight of the epoxy resin.

12. The composition of claim 1 in which the epoxy resin is a liquid at room temperature.

13. The composition of claim 5 in which the free radical initiator is present in an amount of about 0.001 to about 10 weight percent, based on the weight of the epoxy resin.

14. The composition of claim 5 in which the free radical initiator is selected from the group consisting of dialkyl peroxides, tertiary alkyl hydroperoxides and alkyl esters of peroxycarboxylic acids.

15. The composition of claim 1 which further comprises a fibrous reinforcing material.

16. The composition of claim 15 in which the fibrous reinforcing material is selected from the group consisting of chopped glass, glass fibers and carbon fibers.

17. An article of manufacture formed from the cured composition of claim 1.

18. An article of manufacture formed from the cured composition of claim 15.

19. An electrical laminate formed from the cured composition of claim 15.

20. A prepreg comprising a fibrous reinforcing material and the composition of claim 15.

21. A method for improving the flame retardancy of an epoxy resin composition comprising an epoxy resin and a curing agent for the epoxy resin, the method comprising adding to the composition from about 5 to about 70 weight percent, based on the weight of the composition, of a halogenated aromatic vinyl monomer which has the formula

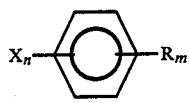

where X is halogen, R is —CH=CH$_2$, alkyl, aryl or alkaryl and at least one R is —CH=CH$_2$, m is 1 to 5 and n is 1 or 2.

22. The method of claim 21 in which the halogenated aromatic vinyl monomer is dibromostyrene.

23. The method of claim 22 in which the dibromostyrene is present in an amount of about 15 to about 50 weight percent.

24. A method for lowering the viscosity of an epoxy resin laminating composition comprising an epoxy resin and a curing agent, the method comprising adding to the composition from about 5 to about 70 weight percent, based on the weight of the composition, of a halogenated aromatic vinyl monomer which has the formula

where X is halogen, R is —CH=CH$_2$, alkyl, aryl or alkaryl and at least one R is —CH=CH$_2$, m is 1 to 5 and n is 1 or 2.

25. The method of claim 24 in which the halogenated aromatic vinyl monomer is dibromostyrene.

* * * * *